(12) United States Patent
Hallin et al.

(10) Patent No.: US 9,306,009 B2
(45) Date of Patent: Apr. 5, 2016

(54) MIX DOPING OF A SEMI-INSULATING GROUP III NITRIDE

(71) Applicant: Cree, Inc., Durham, NC (US)

(72) Inventors: Christer Hallin, Chapel Hill, NC (US); Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 32 days.

(21) Appl. No.: 13/775,661

(22) Filed: Feb. 25, 2013

(65) Prior Publication Data

US 2014/0239308 A1 Aug. 28, 2014

(51) Int. Cl.
| | |
|---|---|
| H01L 29/15 | (2006.01) |
| H01L 29/20 | (2006.01) |
| H01L 21/02 | (2006.01) |
| H01L 29/66 | (2006.01) |
| H01L 29/207 | (2006.01) |
| H01L 29/778 | (2006.01) |

(52) U.S. Cl.
CPC ........ *H01L 29/2003* (2013.01); *H01L 21/0242* (2013.01); *H01L 21/0254* (2013.01); *H01L 21/02378* (2013.01); *H01L 21/02458* (2013.01); *H01L 21/02579* (2013.01); *H01L 21/02581* (2013.01); *H01L 29/207* (2013.01); *H01L 29/66462* (2013.01); *H01L 29/7787* (2013.01)

(58) Field of Classification Search
CPC ............................ H01L 33/30; H01L 29/2003
USPC .......................................................... 257/13
See application file for complete search history.

(56) References Cited

U.S. PATENT DOCUMENTS

| | | | |
|---|---|---|---|
| 7,170,095 B2 | 1/2007 | Vaudo et al. | |
| 2005/0145874 A1 | 7/2005 | Saxler | |
| 2006/0108606 A1* | 5/2006 | Saxler et al. | 257/200 |
| 2006/0214193 A1* | 9/2006 | Hayamura et al. | 257/213 |
| 2007/0015299 A1* | 1/2007 | Saxler | 438/22 |
| 2010/0096614 A1* | 4/2010 | Kim et al. | 257/13 |
| 2012/0025203 A1 | 2/2012 | Nakata et al. | |

OTHER PUBLICATIONS

Bahat-Treidel, Eldad et al., "AlGaN/GaN/GaN:C Back-Barrier HFETs With Breakdown Voltage of Over 1 kV and Low Ron x A," IEEE Transactions on Electron Devices, vol. 57, No. 11, Nov. 2010, pp. 3050-3058.

Heikman, S. et al., "Growth and Characteristics of Fe-Doped GaN," Journal of Crystal Growth, vol. 248, 2003, pp. 513-517.

(Continued)

*Primary Examiner* — Ajay K Arora
(74) *Attorney, Agent, or Firm* — Myers Bigel & Sibley, P.A.

(57) ABSTRACT

Embodiments of a semi-insulating Group III nitride and methods of fabrication thereof are disclosed. In one embodiment, a semi-insulating Group III nitride layer includes a first doped portion that is doped with a first dopant and a second doped portion that is doped with a second dopant that is different than the first dopant. The first doped portion extends to a first thickness of the semi-insulating Group III nitride layer. The second doped portion extends from approximately the first thickness of the semi-insulating Group III nitride layer to a second thickness of the semi-insulating Group III nitride layer. In one embodiment, the first dopant is Iron (Fe), and the second dopant is Carbon (C). In another embodiment, the semi-insulating Group III nitride layer is a semi-insulating Gallium Nitride (GaN) layer, the first dopant is Fe, and the second dopant is C.

27 Claims, 7 Drawing Sheets

(56) References Cited

OTHER PUBLICATIONS

Silvestri et al., "Iron-induced deep-level acceptor center in GaN/AlGaN high electron mobility transistors: Energy level and cross section," Applied Physics Letters, vol. 102, No. 7, Feb. 18, 2013, 4 pages.

International Search Report and Written Opinion for PCT/US2014/017658, mailed Apr. 24, 2014, 10 pages.

* cited by examiner

GROWTH SUBSTRATE
46

FIG. 5A

Fe DOPED PORTION
34

GROWTH SUBSTRATE
46

FIG. 5B

C DOPED PORTION 36

Fe DOPED PORTION
34

GROWTH SUBSTRATE
46

FIG. 5C ial Field Effect Transistor
MIX DOPING OF A SEMI-INSULATING GROUP III NITRIDE

FIELD OF THE DISCLOSURE

The present disclosure relates to a semi-insulating Group III nitride and methods of manufacturing the same and more particularly relates to mixed doping of a semi-insulating Group III nitride (e.g., Gallium Nitride) where the semi-insulating Group III nitride is useful as, inter alia, a buffer layer of a semiconductor device.

BACKGROUND

Group III nitrides such as Gallium Nitride (GaN) and related III-V alloys are highly desirable materials for semiconductor devices and particularly for high temperature and high frequency applications. In many semiconductor devices such as, for example, lateral Field Effect Transistors (FETs) for high frequency applications, a semi-insulating GaN buffer layer is highly desirable. Due to the lack of large area native GaN substrates, semi-insulating GaN is most often grown on a heteroepitaxial substrate such as Silicon Carbide (SiC) or sapphire. The use of a heteroepitaxial substrate is problematic due to lattice mismatch between the heteroepitaxial substrate and the GaN. As such, the GaN must be grown to a sufficient thickness to overcome the tension or stress induced by the lattice mismatch. Further, because epitaxially grown GaN includes impurities, the GaN must be sufficiently doped to become semi-insulating. For example, U.S. Pat. No. 7,170,095 entitled "Semi-Insulating GaN and Method of Making the Same," which issued Jan. 30, 2007 and is hereby incorporated herein by reference in its entirety, describes methods of making semi-insulating GaN using a deep acceptor dopant such as, for example, Manganese (Mn), Iron (Fe), Cobalt (Co), Nickel (Ni), Copper (Cu), or the like to compensate for donor impurities in the GaN. Each dopant typically has advantages and disadvantages. As such, there is a need for improved doping for a semi-insulating Group III nitride and, in particular, improved doping for semi-insulating GaN.

SUMMARY

Embodiments of a semi-insulating Group III nitride and methods of fabrication thereof are disclosed. In one embodiment, a semi-insulating Group III nitride layer includes a first doped portion that is doped with a first dopant and a second doped portion that is doped with a second dopant that is different than the first dopant. The first doped portion extends to a first thickness of the semi-insulating Group III nitride layer. The second doped portion extends from approximately the first thickness of the semi-insulating Group III nitride layer to a second thickness of the semi-insulating Group III nitride layer. In one embodiment, the first dopant is Iron (Fe), and the second dopant is Carbon (C). In another embodiment, the semi-insulating Group III nitride layer is a semi-insulating Gallium Nitride (GaN) layer, the first dopant is Fe, and the second dopant is C.

In one embodiment, the semi-insulating Group III nitride layer is a semi-insulating GaN layer, the first dopant is Fe, and the second dopant is C. Due to the growth process, a residual amount of Fe doping is present in the C doped portion where the residual amount of Fe doping decreases as a thickness of the C doped portion increases. The thickness of the C doped portion is sufficient to enable the residual Fe doping concentration in the C doped portion to decrease to a predetermined acceptable residual Fe doping concentration across the C doped portion. The Fe doped portion enables the semi-insulating GaN layer to be grown to a desired thickness with low dislocation density while the C doped portion reduces a memory effect, or amount of traps, resulting from the Fe doping. This is particularly beneficial where the semi-insulating GaN layer is a semi-insulating GaN buffer layer of a semiconductor device such as a lateral Field Effect Transistor (FET) (e.g., a lateral High Electron Mobility Transistor (HEMT)).

In one embodiment, a semiconductor device includes a semi-insulating Group III nitride layer, a barrier layer on the semi-insulating Group III nitride layer, and source, gate, and drain contacts on the barrier layer opposite the semi-insulating Group III nitride layer. The semi-insulating Group III nitride layer includes a first doped portion that is doped with a first dopant and a second doped portion that is doped with a second dopant that is different than the first dopant. The first doped portion extends to a first thickness of the semi-insulating Group III nitride layer. The second doped portion extends from approximately the first thickness of the semi-insulating Group III nitride layer toward the barrier layer to a second thickness of the semi-insulating Group III nitride layer. In one embodiment, the first dopant is Fe, and the second dopant is C. In another embodiment, the semi-insulating Group III nitride layer is GaN, the first dopant is Fe, and the second dopant is C.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A through 5G graphically illustrate fabrication of the FET of FIG. 3 according to one embodiment of the present disclosure.

DETAILED DESCRIPTION

Figure 1:
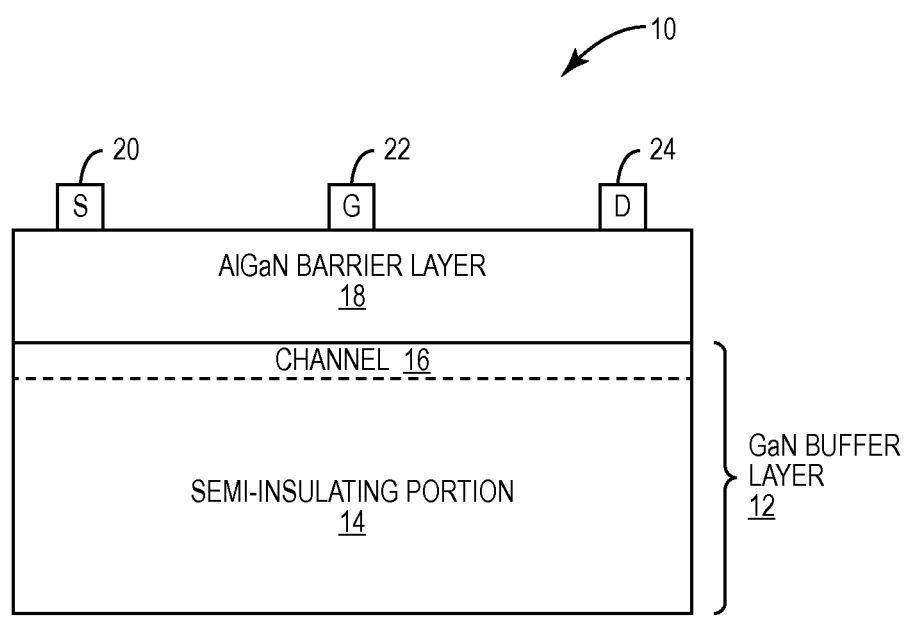
FIG. 1 illustrates one example of a conventional Field Effect Transistor (FET) that includes a semi-insulating Gallium Nitride (GaN) base layer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to embodiments of a semi-insulating Group III nitride and methods of fabrication thereof. While the discussion below focuses on Gallium Nitride (GaN), the present disclosure is not limited thereto. The present disclosure is applicable to other Group III nitrides and, in particular, other Group III-V nitrides such as (Ga, Al, In)N, where "(Ga, Al, In)N" refers to metal nitride compositions in which the metal moiety can be one, two, or all three of Gallium (Ga), Aluminum (Al), and Indium (In) in appropriate stoichiometric ratio (e.g., GaN, AlN, InN, AlGaN, InGaN, AlInN, or AlGaInN). The stoichiometric proportions of the metals in the multi-metal III-V nitride compositions will be understood to encompass integer as well as non-integer values. For example, it is understood that the term AlGaN refers to $Al_xGa_{1-x}N$ where $0<=x<=1$.

Before describing embodiments of a semi-insulating GaN and methods of fabrication thereof, a discussion of conventional semi-insulating GaN and, in particular, a conventional semi-insulating GaN buffer layer in a lateral Field Effect Transistor (FET) is beneficial. In this regard, FIG. 1 illustrates a conventional High Electron Mobility Transistor (HEMT) 10, which is one type of lateral FET. As illustrated, the HEMT 10 includes a semi-insulating GaN buffer layer 12 that includes a semi-insulating portion 14 and a channel 16. The HEMT 10 also includes an Aluminum Gallium Nitride (AlGaN) barrier layer 18 on the semi-insulating GaN buffer layer 12 adjacent to the channel 16. Lastly, the HEMT 10 includes a source contact 20, a gate contact 22, and a drain contact 24 on the AlGaN barrier layer 18 opposite the semi-insulating GaN buffer layer 12. The semi-insulating portion 14 of the semi-insulating GaN buffer layer 12 serves as a back barrier against which the gate contact 22 can deplete the channel 16.

Since it is difficult to grow pure GaN (which would be semi-insulating), the semi-insulating GaN buffer layer 12 is typically grown on a heteroepitaxial substrate (e.g., a Silicon Carbide (SiC) substrate, a sapphire substrate, or the like) and doped with an appropriate dopant to compensate impurities in the GaN such that the GaN is semi-insulating or negatively charged. The two most common dopants used for semi-insulating GaN are Iron (Fe) and Carbon (C). However, the inventors have found that each of these dopants (Fe and C) have substantial issues. In particular, Fe doping results in large memory effects, which is undesirable particularly for high frequency (e.g., Radio Frequency (RF)) applications. In contrast, C doping results in a substantial amount of defects when growing thick GaN (e.g., greater than 0.5 micrometers or greater than 1 micrometer). As will be understood by one of ordinary skill in the art, it is desirable for the semi-insulating GaN buffer layer 12 to be thick in order to alleviate stress due to lattice mismatch when growing the semi-insulating GaN buffer layer 12 on a heteroepitaxial substrate.

More specifically, when growing the semi-insulating GaN buffer layer 12, it is desirable to have a sharp turn-off of the doping at an interface between the semi-insulating portion 14 and the channel 16. However, a sharp turn-off of Fe doping is not possible, or is difficult to achieve, when using Fe doping in a Metal Organic Chemical Vapor Deposition (MOCVD) growth process. As a result, after turning off Fe doping, there is a residual amount of Fe doping in the subsequently grown GaN. Thus, one must choose between larger memory effects (i.e., a higher amount of traps) due to a high amount of residual Fe doping in the channel 16 or higher current leaking into the semi-insulating portion 14 of the semi-insulating GaN buffer layer 12 due to a low amount of residual Fe doping in the semi-insulating portion 14 of the semi-insulating GaN buffer layer 12 near the channel 16.

Figure 2A:
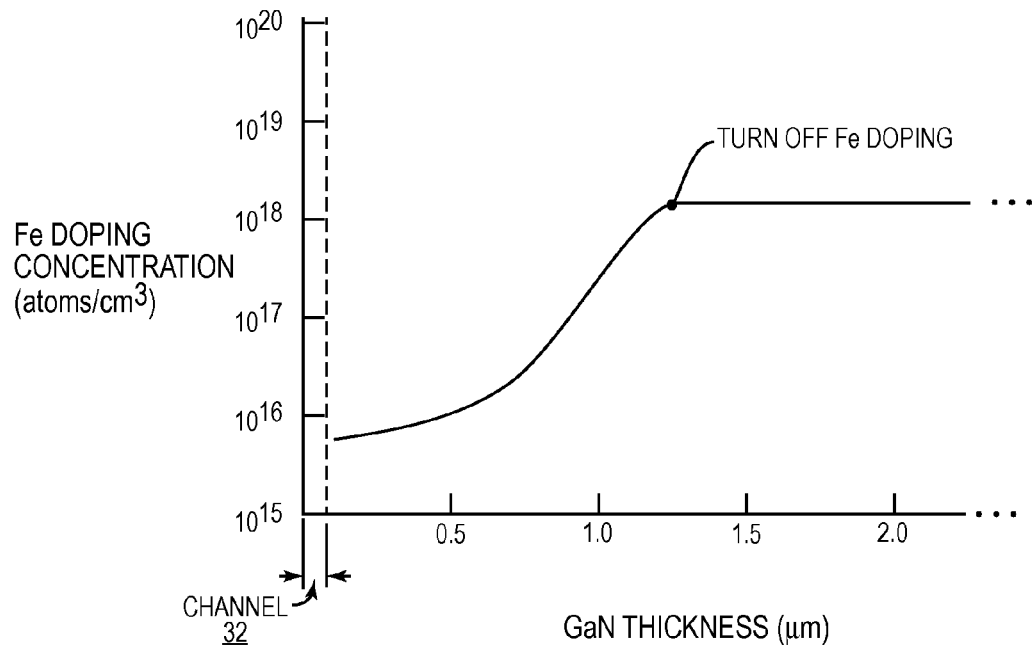
FIGS. 2A and 2B illustrate two examples of a doping profile of the semi-insulating GaN base layer of FIG. 1 where the semi-insulating GaN base layer is made semi-insulating by doping with Iron (Fe) during a Metal Organic Chemical Vapor Deposition (MOCVD) growth process.
Figure 2B:
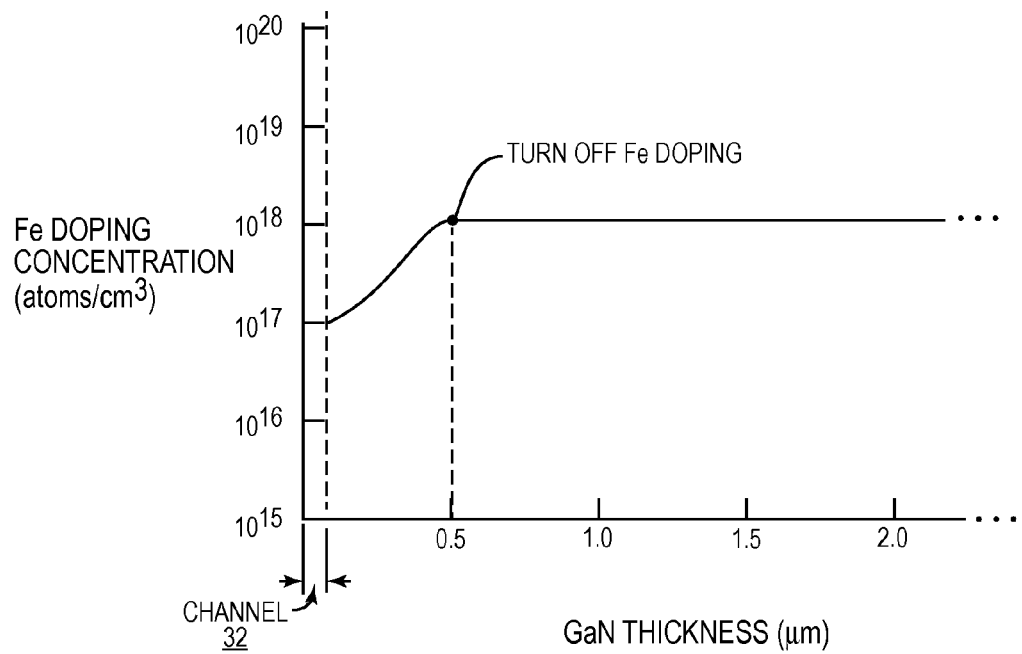

This trade-off is illustrated in FIGS. 2A and 2B. FIG. 2A illustrates a situation where the Fe doping is turned off well in advance of the channel 16 such that the amount of residual Fe doping at the interface with the channel 16 is below a predetermined acceptable level, which in this case is $10^{16}$ atoms per cubic centimeter ($cm^3$). While this results in low memory effects in the channel 16, the low amount of Fe doping in the semi-insulating portion 14 of the semi-insulating GaN buffer layer 12 near the channel 16 results in higher current leakage into the semi-insulating portion 14 of the semi-insulating GaN buffer layer 12. In contrast, FIG. 2B illustrates a situation where the Fe doping is turned off closer to the channel 16. In this case, the residual amount of Fe doping in the channel 16 is higher and, as such, there is lower current leakage into the semi-insulating portion 14 of the semi-insulating GaN buffer layer 12. However, the higher residual Fe doping in the channel 16 increases the memory effect in the channel 16 (i.e., increase the amount of traps in the channel 16). As such, when using Fe doping, one must choose between higher current leakage and higher memory effects.

In contrast to Fe doping, when growing the semi-insulating GaN buffer layer 12 using MOCVD or a similar growth process, C doping provides a sharp turn-off of the doping at the interface between the semi-insulating portion 14 and the channel 16. However, the growth conditions required for high C doping result in a substantial amount of dislocations, or defects, in the semi-insulating GaN buffer layer 12 particularly for thicknesses greater than 0.5 micrometers and even more particularly for thicknesses greater than 1 micrometer. The thickness of the semi-insulating GaN buffer layer 12 is preferably greater than 0.5 micrometers and even more preferably greater than 1 micrometer in order to alleviate the stress resulting from a lattice mismatch between the semi-insulating GaN buffer layer 12 and the heteroepitaxial substrate on which the semi-insulating GaN buffer layer 12 is grown. Because a thick layer of GaN is desired, high C doping results in a substantial amount of defects in the semi-insulating GaN buffer layer 12, which in turn results in a higher risk of current collapse.

Figure 3:
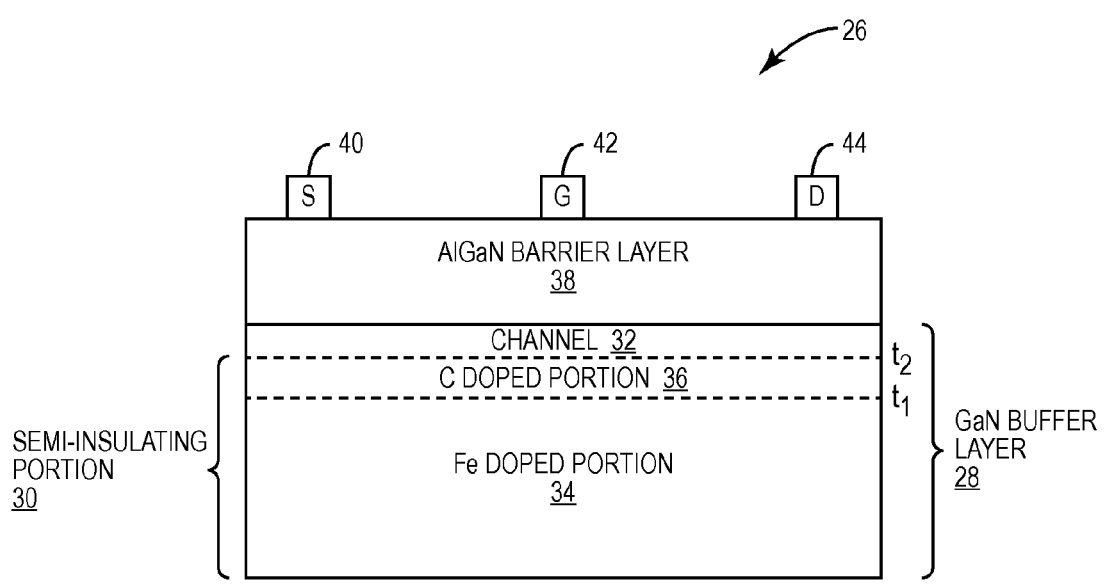
FIG. 3 illustrates one example of a FET that includes a semi-insulating GaN base layer having mixed doping according to one embodiment of the present disclosure.

The semi-insulating GaN and methods of fabrication thereof disclosed herein provide reduced memory effects, reduced current leakage, and a reduced amount of defects. In this regard, FIG. 3 illustrates a HEMT 26 that includes a semi-insulating GaN buffer layer 28 according to one embodiment of the present disclosure. Before proceeding, it should be noted that while the HEMT 26 is illustrated in this embodiment, the semi-insulating GaN buffer layer 28 may be utilized in other types of semiconductor devices in which a semi-insulating GaN buffer layer is desired. Further, while semi-insulating GaN is utilized in this embodiment, as discussed above, other Group III nitrides may be used.

As illustrated, the semi-insulating GaN buffer layer 28 includes a semi-insulating portion 30 and a channel portion 32 on the semi-insulating portion 30. Further, the semi-insulating portion 30 includes a Fe doped portion 34 and a C doped portion 36. The Fe doped portion 34 extends from a bottom surface of the semi-insulating GaN buffer layer 28 to a first thickness ($t_1$) within the semi-insulating GaN buffer layer 28. The C doped portion 36 is on the Fe doped portion 34 and extends from the first thickness ($t_1$) within the semi-insulating GaN buffer layer 28 to a second thickness ($t_2$) within the semi-insulating GaN buffer layer 28. A thickness of the Fe doped portion 34 is greater than or equal to 0.5 micrometers (e.g., in a range of and including 0.5 to 10 micrometers) or more preferably greater than or equal to 1 micrometer (e.g., in a range of and including 1 to 10 micrometers) in order to, among other things, alleviate stress in the semi-insulating GaN buffer layer 28 due to a lattice mismatch between the semi-insulating GaN buffer layer 28 and a heteroepitaxial substrate on which the semi-insulating GaN buffer layer 28 is grown. A doping concentration of Fe in the Fe doped portion 34 is in a range of and including $10^{17}$ to $10^{19}$ atoms per cm$^3$. The doping concentration of Fe in the Fe doped portion 34 may be constant or may vary over the thickness of the Fe doped portion 34.

When growing the Fe doped portion 34 using MOCVD or a similar process, Fe doping is turned off at the point the semi-insulating GaN buffer layer 28 reaches the first thickness ($t_1$). However, there is a residual amount of Fe doping throughout the C doped portion 36 and the channel portion 32 due to the growth process. A residual Fe doping concentration of the residual Fe doping decreases with thickness or, in other words, decreases throughout the C doped portion 36 and the channel portion 32. In one preferred embodiment, C doping is turned on at approximately the same time that the Fe doping is turned off. However, in an alternative embodiment, C doping may be turned on before Fe doping is turned off.

A thickness of the C doped portion 36 is such that the residual Fe doping concentration at the interface between the C doped portion 36 and the channel portion 32 is less than a predetermined acceptable Fe doping level and an amount of defects resulting from growth of the C doped portion 36 is less than a predetermined threshold amount of defects. In one embodiment, the predetermined acceptable Fe doping level at the interface between the C doped portion 36 and the channel portion 32 is less than $2\times10^{16}$ atoms per cm$^3$. For example, in one particular embodiment, the predetermined acceptable Fe doping level at the interface between the C doped portion 36 and the channel portion 32 is a value in a range of and including $5\times10^{15}$ to $2\times10^{16}$ atoms per cm$^3$ (e.g., $5\times10^{15}$ or $1\times10^{16}$ atoms per cm$^3$). Note, however, that the predetermined acceptable Fe doping level may, in some embodiments, be lower than $5\times10^{15}$ atoms per cm$^3$. In one embodiment, the predetermined threshold amount of defects is $1\times10^9$ defects per cm$^2$. However, this is just one example. In one particular embodiment, the thickness of the C doped portion 36 is in a range of and including 0.1 to 1.5 micrometers and, even more preferably, in a range of and including 0.1 to 1 micrometers. However, the thickness of the C doped portion 36 may vary depending on the doping concentration of Fe in the Fe doped portion 34 particularly at the interface between the Fe doped portion 34 and the C doped portion 36. Notably, in one embodiment, the doping concentration of C in the C doped portion 36 is graded. In particular, the doping concentration of C in the C doped portion 36 may increase from a lower concentration near the Fe doped portion 34 to a high concentration at the interface between the C doped portion 36 and the channel portion 32. In this case, it is desirable to maintain the thickness of a highly doped portion of the C doped portion 36 below a predetermined maximum thickness beyond which the amount of defects in the C doped portion 36 increases above the predetermined threshold amount.

The Fe doped portion 34 enables the semi-insulating GaN buffer layer 28 to be grown to a large thickness (e.g., greater than or equal to 0.5 micrometers or more preferably greater than or equal to 1 micrometer) without having an undesirably large amount of dislocations. The C doped portion 36 reduces memory effects (i.e., traps) in the channel portion 32 while keeping leakage current into the semi-insulating portion 30 of the semi-insulating GaN buffer layer 28 low. Thus, the semi-insulating GaN buffer layer 28 provides improved performance for the HEMT 26.

In addition to the semi-insulating GaN buffer layer 28, the HEMT 26 includes an AlGaN barrier layer 38 on the semi-insulating GaN buffer layer 28 adjacent to the channel portion 32. The AlGaN barrier layer 38 is only one example of a barrier layer. The barrier layer 38 may be formed of materials other than AlGaN (e.g., Aluminum Nitride (AlN)). Lastly, the HEMT 26 includes a source contact 40, a gate contact 42, and drain contact 44 on the AlGaN barrier layer 38 opposite the semi-insulating GaN buffer layer 28.

Figure 4:
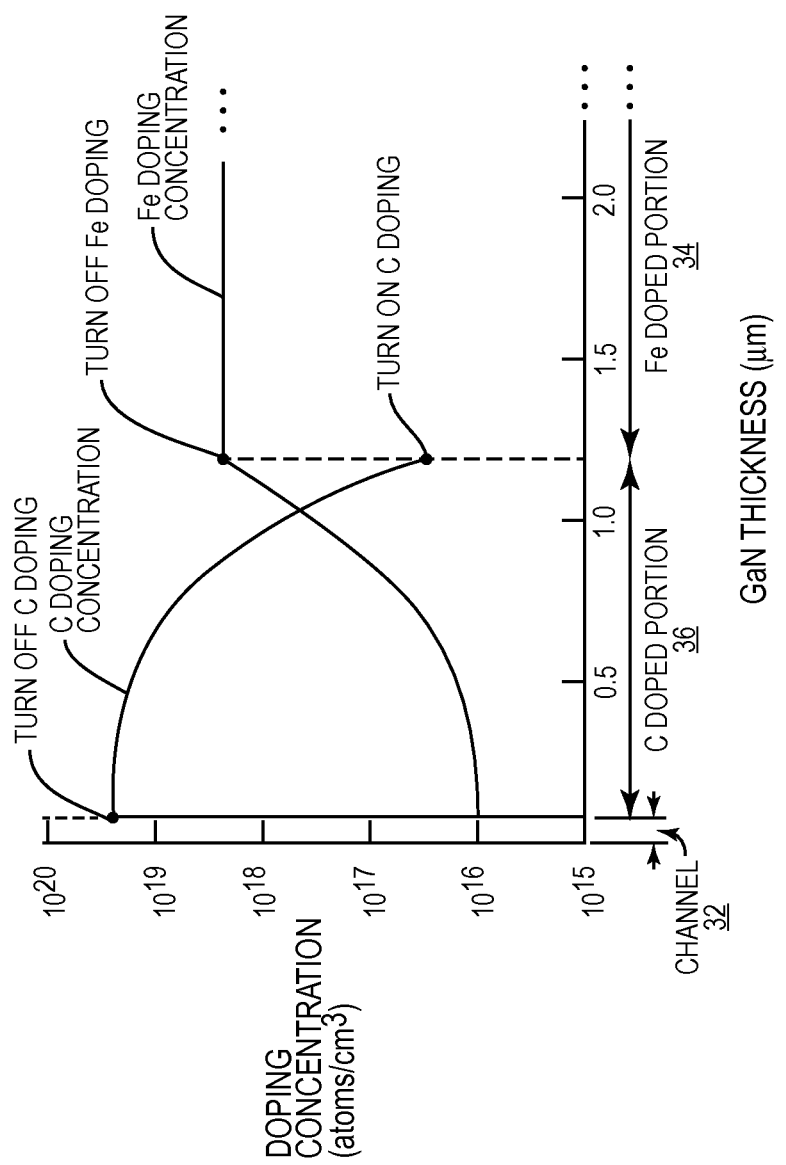
FIG. 4 illustrates one example of a doping profile of the semi-insulating GaN base layer of FIG. 3 according to one embodiment of the present disclosure.

FIG. 4 illustrates one example of a doping profile of the semi-insulating GaN buffer layer 28 of FIG. 3 according to one embodiment of the present disclosure. As illustrated, in this example, Fe doping is turned off and C doping is turned on at approximately 1.2 micrometers from the surface of the channel portion 32. The doping concentration of Fe in the Fe doped portion 34 is approximately $5 \times 10^{18}$ atoms per $cm^3$. In addition, in this embodiment, the semi-insulating GaN buffer layer 28 is grown using MOCVD. As such, after Fe doping is turned off, there is still a residual amount of Fe doping that decreases with thickness. In this example, over the thickness of the C doped portion 36, the residual Fe doping decrease from approximately $5 \times 10^{18}$ atoms per $cm^3$ to approximately $1 \times 10^{16}$ atoms per $cm^3$. Conversely, the C doping increases from approximately $5 \times 10^{16}$ atoms per $cm^3$ to $5 \times 10^{19}$ atoms per $cm^3$ over the thickness of the C doped portion 36 and then, at the interface to the channel portion 32, the C doping is turned off. As illustrated, there is a sharp turn-off for C doping when using MOCVD. Using this doping profile, the residual Fe doping in the channel portion 32, and thus the memory effect (i.e., amount of traps) in the channel portion 32, is small. In addition, the C doped portion 36 results in low leakage current into the semi-insulating portion 30 of the semi-insulating GaN buffer layer 28.

Figure 5D:
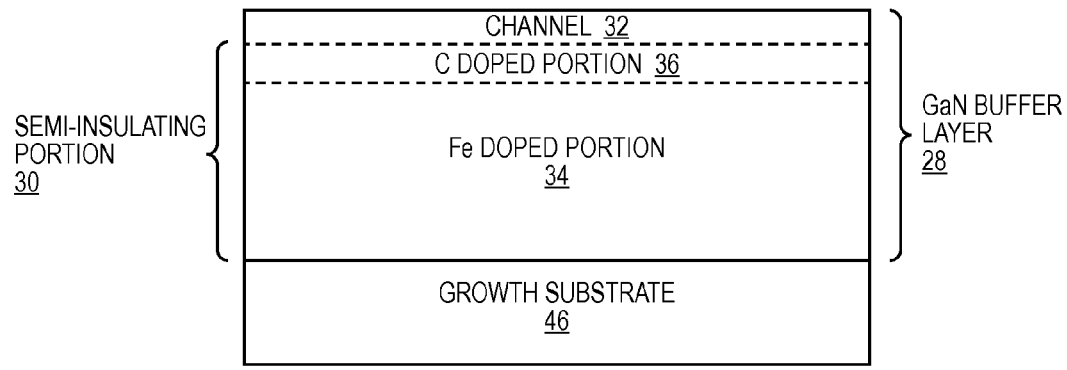

FIGS. 5A through 5G graphically illustrate a method of fabrication of the HEMT 26 of FIG. 3 according to one embodiment of the present disclosure. First, the process begins with a growth substrate 46 as illustrated in FIG. 5A. The growth substrate 46 may be, for example, a SiC or sapphire substrate. Next, the Fe doped portion 34 of the semi-insulating GaN buffer layer 28 is grown on the growth substrate 46 as illustrated in FIG. 5B. In this embodiment, the growth process is MOCVD. As discussed above, the doping concentration of the Fe doped portion 34 is preferably in a range of and including $10^{17}$ to $10^{19}$ atoms per $cm^3$, and a thickness of the Fe doped portion 34 is preferably in the range of and including 0.5 to 10 micrometers or more preferably in the range of and including 1 to 10 micrometers. The Fe doping concentration may be constant over the thickness of the Fe doped portion 34 or may vary over the thickness of the Fe doped portion 34.

Next, Fe doping is turned off and C doping is turned on to grow the C doped portion 36 as illustrated in FIG. 5C. Again, as discussed above, the doping concentration of C in the C doped portion 36 is preferably greater than $10^{18}$ atoms per $cm^3$ (e.g., in the range of and including $10^{18}$ to $10^{20}$ atoms per $cm^3$) or more preferably greater than $10^{19}$ atoms per $cm^3$ (e.g., in the range of and including $10^{19}$ to $10^{20}$ atoms per $cm^3$). The thickness of the C doped portion 36 is sufficiently large to allow the residual Fe doping in the C doped portion 36 to decrease to an acceptable level (e.g., less than $10^{16}$ atoms per $cm^3$) and small enough as to not result in an unacceptable amount of defects. Next, C doping is turned off to grow the channel portion 32 as illustrated in FIG. 5D. The thickness of the channel portion 32 can range from 0 (i.e., no channel portion 32) to approximately 0.6 microns.

Figure 5E:
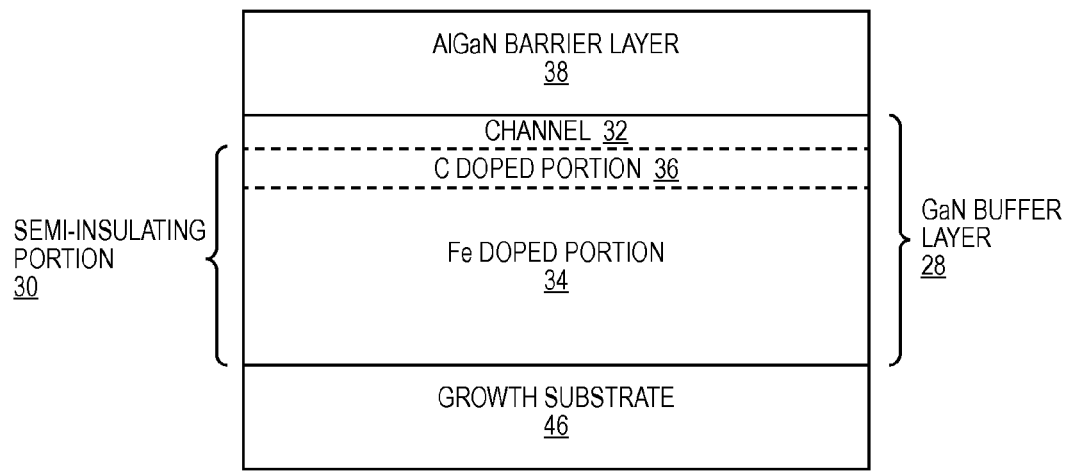
Figure 5F:
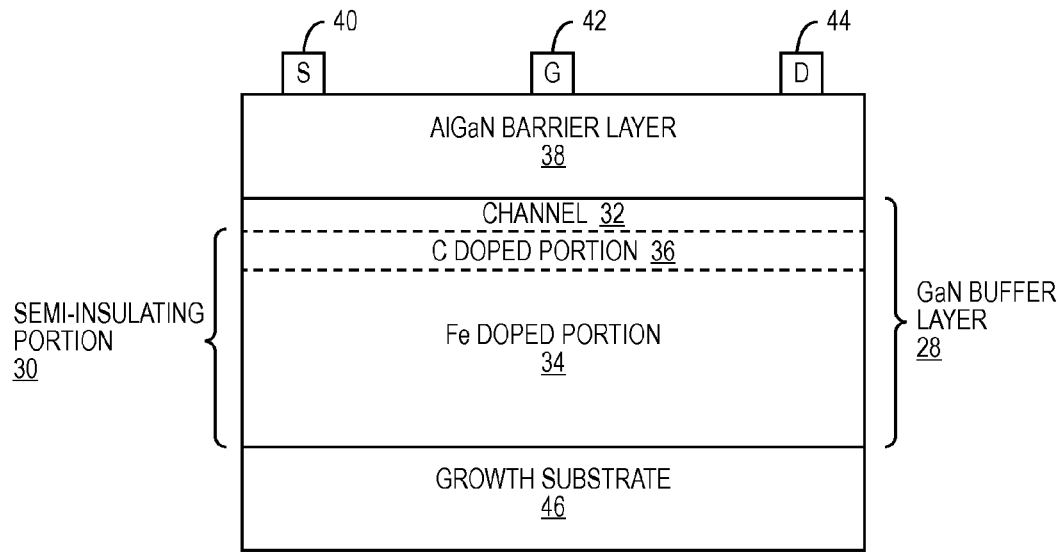
Figure 5G:
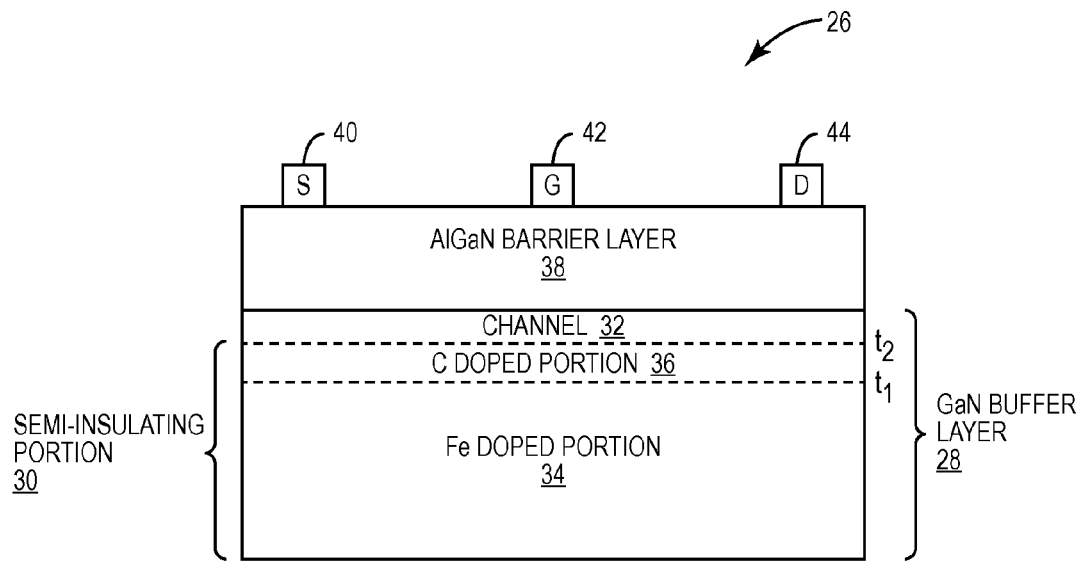

Once growth of the semi-insulating GaN buffer layer 28 is complete, the AlGaN barrier layer 38 is grown on the semi-insulating GaN buffer layer 28 adjacent to the channel portion 32, as illustrated in FIG. 5E. The source contact 40, the gate contact 42, and the drain contact 44 are formed on the AlGaN barrier layer 38 as illustrated in FIG. 5F. Lastly, the HEMT 26 is removed from the growth substrate 46 as illustrated in FIG. 5G. Note that the growth substrate 46 may be removed earlier in the process depending on the particular implementation. It should also be noted that the HEMT 26 may include additional layers that are not shown.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    a semi-insulating Group III nitride layer having a top surface and a bottom surface, the semi-insulating Group III nitride layer having:
        a lower portion that is adjacent the bottom surface that is doped with a first dopant; and
        an upper portion that is adjacent the top surface that is doped with a second dopant that is different than the first dopant,
    wherein a concentration of the first dopant in the lower portion exceeds a concentration of the second dopant in the lower portion throughout the lower portion,
    wherein a concentration of the second dopant in at least a top part of the upper portion exceeds a concentration of the first dopant in at least the top part of the upper portion throughout the top part of the upper portion.

2. The semiconductor device of claim 1 wherein the first dopant is Iron and the second dopant is Carbon.

3. The semiconductor device of claim 2 wherein the semi-insulating Group III nitride is semi-insulating Gallium Nitride, and wherein the lower portion is not doped with the second dopant.

4. The semiconductor device of claim 3 wherein a doping concentration of Iron in the Ire lower portion is in a range of and including $10^{17}$ to $10^{19}$ atoms per cubic centimeter, and a doping concentration of Carbon in at least the top part of the upper portion is greater than or equal to $10^{18}$ atoms per cubic centimeter.

5. The semiconductor device of claim 4 wherein the doping concentration of Carbon in the top part of the upper portion is more particularly greater than or equal to $10^{19}$ atoms per cubic centimeter.

6. The semiconductor device of claim 4 wherein a concentration of the second dopant is less than a concentration of the first dopant in a lower part of the upper portion.

7. The semiconductor device of claim 6 wherein the doping concentration of the first dopant in the top part of the upper portion is between $5 \times 10^{15}$ and $2 \times 10^{16}$ atoms per cubic centimeter.

8. The semiconductor device of claim 7 wherein a thickness of the lower portion is in a range of 0.5 to 10 micrometers.

9. The semiconductor device of claim 1 wherein:
    the upper portion contains residual doping of the first dopant from the lower portion, and wherein a residual doping concentration of the residual doping decreases with increasing distance from the lower portion.

10. The semiconductor device of claim 1 wherein the lower portion is not doped with the second dopant and wherein the upper portion has a graded concentration of the first dopant that decreases with increasing distance from the lower portion.

11. The semiconductor device of claim 1 wherein the semi-insulating Group III nitride is a semi-insulating Group III nitride buffer layer.

12. The semiconductor device of claim 11 wherein the semiconductor device is a Field Effect Transistor, and:
    wherein the semi-insulating Group III nitride buffer layer is part of a Group III nitride buffer layer, the Group III nitride buffer layer further comprising a channel portion on the upper portion of the semi-insulating Group III nitride buffer layer opposite the first doped lower portion of the semi-insulating Group III nitride buffer layer; and the Field Effect Transistor further comprises:

a barrier layer on a surface of the Group III nitride buffer layer adjacent to the channel portion and opposite to the lower and upper portions; and a source contact, a gate contact, and a drain contact on the barrier layer opposite the Group III nitride buffer layer.

13. The semiconductor device of claim 12 wherein:

the Group III nitride buffer layer is a semi insulating Gallium Nitride buffer layer;

the first dopant is Iron; and the second dopant is Carbon.

14. The semiconductor device of claim 13 wherein a doping concentration of Iron in the lower portion is in a range of and including $10^{17}$ to $10^{19}$ atoms per cubic centimeter, and a doping concentration of Carbon in at least the top part of the upper portion is greater than or equal to $10^{18}$ atoms per cubic centimeter.

15. The semiconductor device of claim 14 wherein the doping concentration of Carbon in the top part of the upper portion is greater than or equal to $10^{19}$ atoms per cubic centimeter.

16. The semiconductor device of claim 14 wherein the first dopant has a graded doping concentration in the upper portion.

17. The semiconductor device of claim 16 wherein the doping concentration of the first dopant in the top part of the upper portion is between $5 \times 10^{15}$ and $2 \times 10^{16}$ atoms per cubic centimeter.

18. The semiconductor device of claim 17 wherein a thickness of the lower portion is in a range of 0.5 to 10 micrometers.

19. The semiconductor device of claim 1, wherein the first and second dopants each have a respective graded doping concentration in the upper portion.

20. The semiconductor device of claim 19, wherein in the upper portion the graded doping concentration of the first dopant decreases with increasing distance from the lower portion and the graded doping concentration of the second dopant increases with increasing distance from the lower portion.

21. The semiconductor device of claim 1, wherein the lower portion has a thickness of at least 0.5 microns and the upper portion has a thickness of at least 0.1 microns.

22. The semiconductor device of claim 1, wherein the upper portion has a graded doping concentration for the second dopant such that the doping concentration of the second dopant increases with increasing distance from the lower portion.

23. A semiconductor device comprising:

a semi-insulating Group III nitride layer having:

a first portion that is doped with Iron and that is not doped with Carbon; and a second portion that is on top of the first portion that is co-doped with Iron and Carbon.

24. The semiconductor device of claim 23, wherein a concentration of Carbon exceeds a concentration of Iron in a top of the second portion and a concentration of Iron exceeds a concentration of Carbon in a bottom of the second portion.

25. The semiconductor device of claim 24, wherein a concentration of Carbon is less than a concentration of Iron in a part of the second portion that is directly adjacent the first portion.

26. The semiconductor device of claim 25, further comprising a Group III nitride channel layer on a top surface of the semi-insulating Group III nitride layer.

27. The semiconductor device of claim 23, further comprising a Group III nitride barrier layer on the Group III nitride channel layer opposite the semi-insulating Group III nitride layer.

* * * * *